(12) United States Patent
Ohashi et al.

(10) Patent No.: US 10,770,645 B2
(45) Date of Patent: Sep. 8, 2020

(54) ORIENTED PIEZOELECTRIC FILM, METHOD FOR PRODUCING THE ORIENTED PIEZOELECTRIC FILM, AND LIQUID DISPENSING HEAD

(71) Applicant: CANON KABUSHIKI KAISHA, Tokyo (JP)

(72) Inventors: Yoshihiro Ohashi, Tokyo (JP); Yoshinori Kotani, Yokohama (JP); Motokazu Kobayashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/435,998

(22) Filed: Jun. 10, 2019

(65) Prior Publication Data
US 2019/0393408 A1 Dec. 26, 2019

(30) Foreign Application Priority Data

Jun. 20, 2018 (JP) .................................. 2018-116838

(51) Int. Cl.
| | | |
|---|---|---|
| H01L 41/187 | (2006.01) | |
| H01L 41/047 | (2006.01) | |
| H01L 41/09 | (2006.01) | |
| H01L 41/318 | (2013.01) | |
| B41J 2/14 | (2006.01) | |
| C04B 41/00 | (2006.01) | |
| C04B 35/468 | (2006.01) | |

(52) U.S. Cl.
CPC ...... *H01L 41/1876* (2013.01); *B41J 2/14233* (2013.01); *C04B 35/4682* (2013.01); *C04B 41/009* (2013.01); *C04B 41/0072* (2013.01); *H01L 41/0477* (2013.01); *H01L 41/0973* (2013.01); *H01L 41/318* (2013.01); *C04B 2235/441* (2013.01); *C04B 2235/48* (2013.01); *C04B 2235/6567* (2013.01); *C04B 2235/768* (2013.01)

(58) Field of Classification Search
CPC ............. H01L 41/1876; H01L 41/0477; H01L 41/0973; H01L 41/318; C04B 335/4682; C04B 335/0072; C04B 335/009; C04B 2235/441; C04B 2235/48; C04B 2235/6567; C04B 2235/768; B41J 2/14223
USPC ....... 310/358; 501/134; 252/62.9 PZ, 62.9 R
See application file for complete search history.

(56) References Cited

U.S. PATENT DOCUMENTS 8,454,747 B2 6/2013 Hosokura
9,455,087 B2 * 9/2016 Takeda .................... H01G 4/10
(Continued)

FOREIGN PATENT DOCUMENTS

CN 106986634 A * 7/2017 ............. C04B 35/49
JP 2010-189221 A 9/2010

OTHER PUBLICATIONS

Kotani et al., U.S. Appl. No. 16/427,680, filed May 31, 2019.
Ohashi et al., U.S. Appl. No. 16/440,098, filed Jun. 13, 2019.

*Primary Examiner* — Thomas M Dougherty
(74) *Attorney, Agent, or Firm* — Venable LLP

(57) ABSTRACT

An oriented piezoelectric film, wherein a crystal forming the oriented piezoelectric film, is a perovskite type crystal of the general formula of $Ba_{1-x}Ca_xTi_{1-y}Zr_yO_3$ ($0 \leq x \leq 0.2$, and $0 \leq y \leq 0.2$), and the oriented piezoelectric film has (111) orientation according to a pseudocubic crystal notation.

4 Claims, 8 Drawing Sheets

(56) References Cited

U.S. PATENT DOCUMENTS 9,458,063 B2\* 10/2016 Yoon .................. C04B 35/468
2019/0304688 A1\* 10/2019 Takahashi ............ H01G 4/1227

\* cited by examiner

ORIENTED PIEZOELECTRIC FILM, METHOD FOR PRODUCING THE ORIENTED PIEZOELECTRIC FILM, AND LIQUID DISPENSING HEAD

BACKGROUND OF THE INVENTION

Field of the Invention

The present invention relates to an oriented piezoelectric film, a method for producing the oriented piezoelectric film, and a liquid dispensing head.

Description of the Related Art

Recently, lead-free dielectric thin films have been sought for the replacement of conventional lead titanate (PT) based dielectric thin films, due to concern about environmental burdens caused by the disposal of various electron devices using a lead-containing dielectric thin film. As a method for producing these films, a sol-gel process have been attracting attention because the sol-gel process allows to provide the precise control of the complicated composition of these films easily, and enables uniform coating onto a large-area type base plate. Examples of such a lead-free dielectric thin film ever made include barium titanate (BT) based films, BTZ based films made by adding Zr to BT films, and BCTZ based films made by adding Ca and Zr to BT films.

As an application of the dielectric thin film, it has been found that the dielectric thin film can be suitably used as an actuator such as ink jet printing head; however, this application of the dielectric thin film in an actuator requires a high piezoelectric constant. In general, the film tends to exhibit a high piezoelectric constant when the film has high orientation, and therefore, in order to use the film in such an application, the film formed by a deposition process including an application step, a calcination step and a burning step must have high orientation. With regard to an example of the production of a BT based film having high orientation by a sol-gel process, the production of an oriented film using a single-crystal seed layer (MgO) is reported, as illustrated in Japanese Patent Application Laid-Open No. 2010-189221.

However, in the above prior art, a single-crystal seed layer (MgO) disposed in addition to an electrode have to be used in order to obtain the oriented film.

SUMMARY OF THE INVENTION

It is an object of the present invention to provide a barium titanate based piezoelectric film having (111) orientation without using a single-crystal seed layer, and a method for producing the barium titanate based piezoelectric film.

According to one aspect of the present invention, there is provided an oriented piezoelectric film including a perovskite type crystal represented by the following general formula (1) $Ba_{1-x}Ca_xTi_{1-y}Zr_yO_3$ ($0 \leq x \leq 0.2$, and $0 \leq y \leq 0.2$) (1), wherein the oriented piezoelectric film is formed on a metallic electrode having (111) orientation, and has (111) orientation according to a pseudocubic crystal notation.

Also, according to one aspect of the present invention, there is provided a method for producing an oriented piezoelectric film, including: (1) disposing a metallic electrode having (111) orientation onto a base plate; (2) heat-treating the base plate at 500° C. or more; (3) applying, onto the base plate, a barium titanate based coating liquid composition including a source material compound of a metal oxide represented by the general formula (1) $Ba_{1-x}Ca_xTi_{1-y}Zr_yO_3$ ($0 \leq x \leq 0.2$, and $0 \leq y \leq 0.2$) (1); (4) calcinating the composition at 100 to 700° C. to form a coat; and (5) burning the coat formed by the calcinating at a temperature of above 700° C.

Further features of the present invention will become apparent from the following description of exemplary embodiments with reference to the attached drawings.

DESCRIPTION OF THE EMBODIMENTS

Figure 1A:
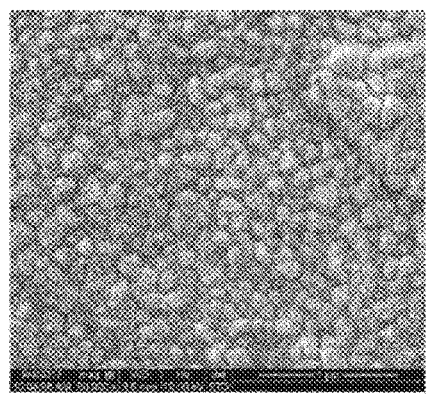
FIG. 1A is a SEM image of a surface of the film obtained in Example 1.
Figure 1B:
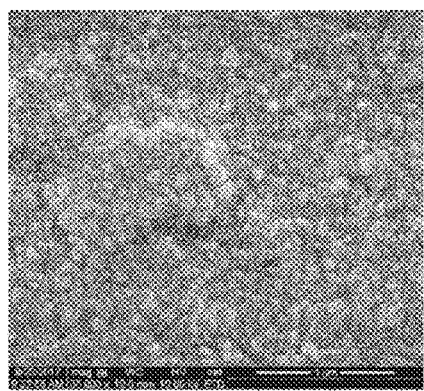
FIG. 1B is a SEM image of a surface of the film obtained in Example 1.
Figure 1C:
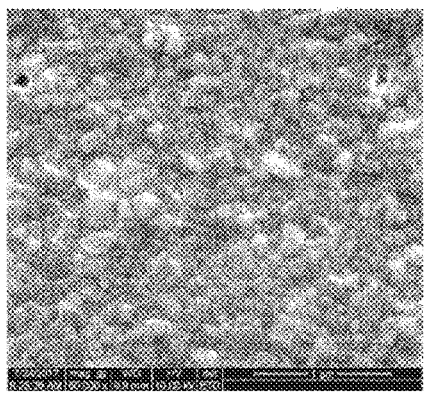
FIG. 1C is a SEM image of a surface of the film obtained in Example 1.
Figure 1D:
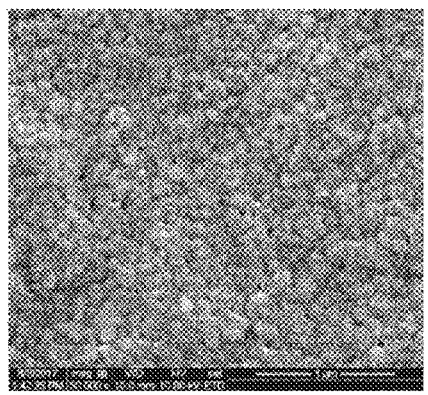
FIG. 1D is a SEM image of a surface of the film obtained in Example 1.
Figure 2A:
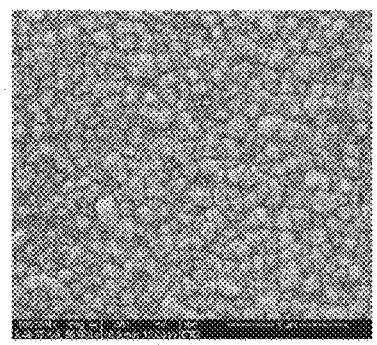
FIG. 2A is a SEM image of a surface of the film obtained in Example 2.
Figure 2B:
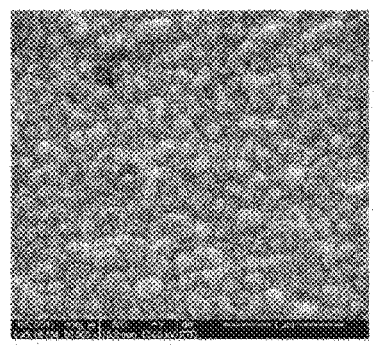
FIG. 2B is a SEM image of a surface of the film obtained in Example 2.
Figure 2C:
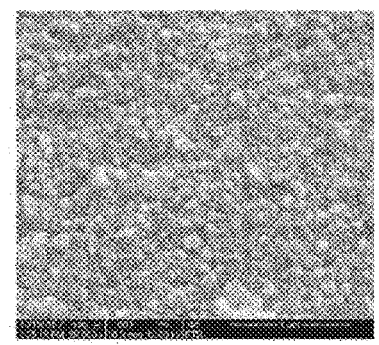
FIG. 2C is a SEM image of a surface of the film obtained in Example 2.
Figure 2D:
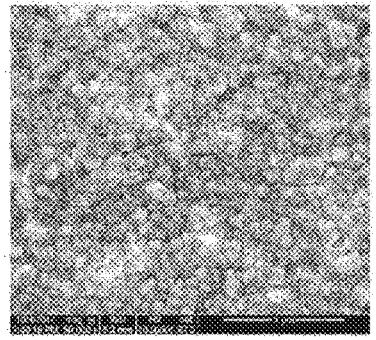
FIG. 2D is a SEM image of a surface of the film obtained in Example 2.
Figure 2E:
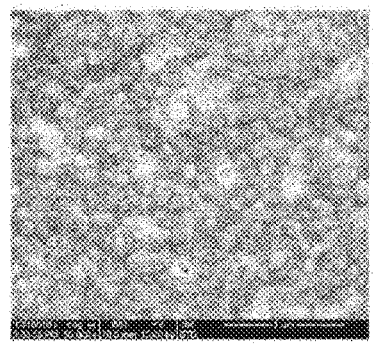
FIG. 2E is a SEM image of a surface of the film obtained in Example 2.
Figure 2F:
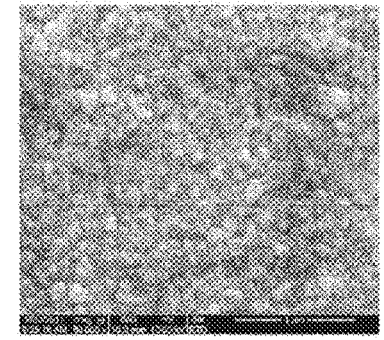
FIG. 2F is a SEM image of a surface of the film obtained in Example 2.

Preferred embodiments of the present invention will now be described in detail in accordance with the accompanying drawings.

An oriented piezoelectric film according to the present invention includes a perovskite type crystal represented by the following general formula (1)

$$Ba_{1-x}Ca_xTi_{1-y}Zr_yO_3 (0 \leq x \leq 0.2, \text{ and } 0 \leq y \leq 0.2) \quad (1),$$

wherein the oriented piezoelectric film is formed on a metallic electrode having (111) orientation, and has (111) orientation according to a pseudocubic crystal notation.

In the present invention, the composition ratios of calcium and zirconium in the above general formula (1) are in a range meeting $0 \leq x \leq 0.2$ and $0 \leq y \leq 0.2$, and is preferably in a range meeting $0 \leq x \leq 0.1$ and $0 \leq y \leq 0.1$. Also, the ratios of (Ba+Ca) to (Ti+Zr) can be more than or less than 1, and can be in a range of $0.95 \leq (Ba+Ca)/(Ti+Zr) \leq 1.05$, and are preferably in a range of $1.00 \leq (Ba+Ca)/(Ti+Zr) \leq 1.02$.

Also, a barium titanate (BT) based film can be in the form of any one of a rhombohedral crystal system, an orthorhombic crystal system, a tetragonal crystal system and a cubic crystal system, or simultaneously in the form of a plurality of crystal systems among the crystal systems mentioned earlier, according to the composition of the barium titanate (BT) based film. However, for the sake of a simple notation, in the present specification, a barium titanate (BT) based film is considered to be in the form of a pseudocubic crystal unless otherwise stated.

Also, in an oriented piezoelectric film according to the present invention, the abundance of (111) orientation determined by a backscattered electron diffraction (EBSD) method is 50% or more on a surface of the oriented piezoelectric film, and in view of an inverse pole figure in a normal line direction of the oriented piezoelectric film, variation in angles of (111) orientation is within 5 degrees.

The embodiments of the present invention will be described below in detail.

<Barium Titanate Based Coating Liquid Composition>

A barium titanate based coating liquid composition according to the present invention includes a source material compound of a metal oxide represented by the general formula (1). Here, the source material compound contains a sol-gel source material including, as an essential component, (i) at least one barium component selected from the group consisting of a barium alkoxide, a hydrolyzate of the barium alkoxide and a condensate of a hydrolyzate of the barium alkoxide. Also, the source material compound contains a sol-gel source material including, as an essential component, (ii) at least one titanium component selected from the group consisting of a titanium alkoxide, a hydrolyzate of the titanium alkoxide and a condensate of a hydrolyzate of the titanium alkoxide. The source material compound contains a sol-gel source material including, as an optional component, (iii) at least one calcium component selected from the group consisting of a calcium alkoxide, a hydrolyzate of the calcium alkoxide and a condensate of a hydrolyzate of the calcium alkoxide. The source material compound contains a sol-gel source material including, as an optional component, (iv) at least one zirconium component selected from the group consisting of a zirconium alkoxide, a hydrolyzate of the zirconium alkoxide and a condensate of a hydrolyzate of the zirconium alkoxide.

As the source material compound of the metal oxide in the barium titanate based coating liquid composition, it is possible to use metal alkoxides, hydrolyzates of metal alkoxides, condensates of hydrolyzates of metal alkoxides, and compounds in the form of salts such as chlorides and nitric acid salts of metals. In view of the stability of the coating liquid and the film uniformity in the formation of the film, a metal alkoxide is preferably used as the source material.

Examples of a barium alkoxide include barium dimethoxide, barium diethoxide, barium di-i-propoxide, barium di-n-propoxide, barium di-i-butoxide, barium di-n-butoxide, and barium di-sec-butoxide. Examples of a calcium alkoxide include calcium dimethoxide, calcium diethoxide, calcium di-n-propoxide, and calcium di-n-butoxide. Examples of a titanium alkoxide include titanium tetramethoxide, titanium tetraethoxide, titanium tetra-n-propoxide, titanium tetraisopropoxide, titanium tetra-n-butoxide, and titanium tetraisobutoxide. Examples of a zirconium alkoxide include zirconium tetraethoxide, zirconium tetra-n-propoxide, zirconium tetraisopropoxide, zirconium tetra-n-butoxide, and zirconium tetra-t-butoxide.

When a metal alkoxide is used as the source material, the metal alkoxide is rapidly hydrolyzed by the addition of moisture or water in the air to the metal alkoxide due to high reactivity of the metal alkoxide toward water, and as a result of this, the solution becomes cloudy with the generation of precipitates. In order to prevent the generation of the cloudy solution and precipitates, a stabilizing agent capable of coordinating with the metal in the metal alkoxide is preferably added for the stabilization of the solution. Specific examples of the stabilizing agent include β-ketoester compounds, β-diketones, amines, and glycols.

As in the case of the present invention, in order not only to stabilize the solution, but also to provide the obtained film with high crystallinity, β-ketoester compounds are preferably used. Specific examples of β-ketoester compounds include methyl acetoacetate, ethyl acetoacetate, butyl acetoacetate, isobutyl acetoacetate, sec-butyl acetoacetate, tert-butyl acetoacetate, hexyl acetoacetate, ethyl 3-oxohexanoate, and methyl isobutyrylacetate.

The above metal alkoxide and the above stabilizing agent are dissolved in an organic solvent to prepare a barium titanate based coating liquid composition. The amount of the organic solvent to be added is preferably of 20 to 30 times in mole based on the total molar amount of the metal alkoxide.

Also, the amount of the stabilizing agent to be used can vary depending on the type of the stabilizing agent, and is set to be, for example, of 1 to 4.5 moles, preferably 2 to 4 moles, per one mole of the barium source material in the barium titanate based coating liquid composition. In particular, when ethyl acetoacetate is used as the stabilizing agent, the amount of the stabilizing agent to be used is preferably set to be of 2 to 4 moles.

As the organic solvent, alcohols, carboxylic acids, aliphatic or alicyclic hydrocarbons, aromatic hydrocarbons, esters, ketones, ethers, other chlorinated hydrocarbons, aprotic polar solvent and the like, or a mixed solvent of two or more of these is used.

As the alcohol, preference is given to, for example, methanol, ethanol, 2-propanol, butanol, 2-methoxyethanol, 2-ethoxyethanol, 1-methoxy-2-propanol, 1-ethoxy-2-propanol, 1-propoxy-2-propanol, 4-methyl-2-pentanol, 2-ethylbutanol, 3-methoxy-3-methylbutanol, ethyleneglycol, diethyleneglycol, and glycerin.

As the carboxylic acid, preference is specifically given to n-butyric acid, α-methylbutyric acid, i-valeric acid, 2-ethylbutyric acid, 2,2-dimethylbutyric acid, 3,3-dimethylbutyric acid, 2,3-dimethylbutyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, 3-ethylhexanoic acid, and the like.

As the aliphatic or alicyclic hydrocarbons, preference is specifically given to n-hexane, n-octane, cyclohexane, cyclopentane, cyclooctane, and the like. As the aromatic hydrocarbons, preference is given to toluene, xylene, ethylbenzene, and the like.

As the esters, preference is given to ethyl formate, ethyl acetate, n-butyl acetate, ethylene glycol monomethyl ether acetate, ethylene glycol monoethyl ether acetate, ethylene glycol monobutyl ether acetate, and the like.

As the ketones, preference is given to acetone, methylethylketone, methyl isobutylketone, cyclohexanon, and the like.

As the ethers, preference is given to dimethoxyethane, tetrahydrofurane, dioxane, diisopropylether, and the like.

Among the solvents described above, alcohols are preferably used in order to prepare the barium titanate based coating liquid composition used in the present invention, in view of the stability of the composition.

The barium titanate based coating liquid composition used in the present invention can be prepared by adding a β-ketoester compound to the organic solvent, and adding metal alkoxides of barium, titanium, requisite calcium and requisite zirconium to the organic solvent, followed by reflux. For example, it is desirable that the above metal alkoxides are mixed into a solution formed by adding the stabilizing agent to the above organic solvent, followed by heating at a temperature in a range of 80 to 200° C., i.e., refluxing for 2 to 10 hours for the sake of the reaction.

Also, where appropriate, the alkoxyl group can be partially hydrolyzed by the addition of water or a catalyst. Examples of the catalyst include nitric acid, hydrochloric acid, sulfuric acid, phosphoric acid, acetic acid, and ammonia. Therefore, a hydrolyzate of a metal alkoxide or a condensate of a hydrolyzate of a metal alkoxide can be included in the coating liquid composition of the present invention.

Also, where appropriate, water soluble organic polymer can be added. Examples of the water soluble organic polymer include polyethylene glycol, polypropyleneglycol, and polyvinylpyrrolidone. The amount of the water soluble organic polymer to be added is preferably in a range of 0.1 to 10 times in mass based on the mass of oxides in the film.

As a result of the above process, it is possible to obtain a barium titanate based coating liquid composition for producing a metal oxide represented by the general formula (1).

<Step of Forming Oriented Piezoelectric Film>

When a coat is formed using the barium titanate based coating liquid composition, an atmosphere for the application of the barium titanate based coating liquid composition is preferably a dry atmosphere (a dry inert gas atmosphere such as dry air or dry nitrogen). The relative humidity of the dry atmosphere is preferably 30% or less.

Furthermore, as the method for applying the solution for the formation of the coat, it is possible to employ a known application method such as a dipping process, a spin coating process, a spraying process, a printing process, a flow coating process, and a combination of these processes, where appropriate. The film thickness can be controlled by changing the pulling up speed in a dipping process, the rotation speed of the base plate in a spin coating process or the like, and by changing the concentration of the solution to be applied.

Although the base plate forming the oriented piezoelectric film of the present invention varies depending on an application of the base plate and the like, it is possible to use, as the base plate, a heat resistant base plate such as a silicon base plate or a sapphire base plate on which a metallic electrode oriented on a (111) plane (also referred to as a lower electrode) has been formed. As the lower electrode formed on the base plate, it is possible to use a metallic material that has an electrical conductivity and that does not react with the piezoelectric film of the present invention, such as platinum (Pt), gold (Au), iridium (Ir) and ruthenium (Ru). Also, it is possible to use a base plate obtained such as by forming the lower electrode on the base plate with interposing an adhesive layer, an insulator film or the like between the lower electrode and the base plate. Specific examples thereof include a base plate having a stacked structure of Pt/Ti/SiO$_2$/Si, Pt/TiO$_2$/SiO$_2$/Si, Pt/IrO/Ir/SiO$_2$/Si, Pt/TiN/SiO$_2$/Si, Pt/Ta/SiO$_2$/Si or Pt/Ir/SiO$_2$/Si (lower electrode/adhesive layer/insulator film/base plate).

For example, with regard to the stacked structure of Pt/Ti/SiO$_2$/Si, an Pt electrode having orientation on (111) plane, which is a close-packed plane, is obtained by depositing Ti as an adhesive layer on thermally oxidized Si base plate by a DC sputtering process, followed by the deposition of Pt by a DC sputtering process. The resulted Si base plate provided with a Pt electrode is subjected to annealing to improve the crystallinity and the crystal grain size of the Pt particle, and as a result of this, a base plate having an improved seed effect of the Pt electrode is obtained.

With regard to conditions of annealing the base plate, exemplary temperature of the annealing depends on the type of the stabilizing agent to be coated subsequently for use in the barium titanate based coating material composition, and can be, for example, at 500 to 1500° C. Also, the temperature of annealing can be at preferably 700 to 1300° C., further preferably 700 to 1200° C., most preferably 900 to 1100° C. Also, with regard to the time of the treatment, heat treatment can be conducted for 5 to 10 minutes. For example, the annealing temperature can be at 500 to 1200° C. when butyl acetoacetate is used as the stabilizing agent, and can be at 900 to 1200° C. when ethyl acetoacetate is used as the stabilizing agent. As a result of this, the seed effect of Pt electrode or the like can be improved.

After the formation of the coat on the base plate, a crystallized film is obtained by subjecting this coat to a series of deposition processes including drying, calcination and further burning. In particular, a deposition process in which the coordination state of the metal alkoxide and the stabilizing agent is controlled, and in which the epitaxial growth according to the Pt electrode subjected to annealing and having orientation on a (111) plane or the like is accomplished is used in order to prepare the coating liquid composition in the present invention. As a result of this, an oriented barium titanate based film having high (111) orientation can be obtained.

As described above, the deposition process includes a drying step, a calcination step and a burning step. In the drying step, heating is conducted at a temperature of 100 to 200° C. for 1 to 5 minutes using hot plate or the like in order to remove a low boiling point component or the adsorbed water molecules in particular. The calcination step is conducted under predetermined conditions using a hot plate, an infrared light-collecting furnace (RTA) or the like. The calcination is conducted in order to remove the solvent, and also to convert a metal compound into a composite oxide by thermal decomposition or hydrolysis, and therefore is preferably conducted in the air, in an oxidative atmosphere or in an atmosphere containing water vapor. With regard to the heating in the air, moisture required for the hydrolysis can be obtained satisfactorily from moisture in the air. The calcination is preferably conducted at a temperature of above 200° C. to 700° C. or less for 1 to 10 minutes. With regard to the steps from application to calcination of the coating liquid composition, when a desired film thickness is achieved by the application in a single time, each of the steps from application to the calcination is conducted in one time, and then the burning step is conducted.

In an alternative manner, the steps from application to the calcination are repeated a plurality of times so as to achieve a desired film thickness, and then, as a final step, the burning step is conducted by one operation. For example, a step of spin-coating a barium titanate based coating liquid composition onto the base plate provided with a Pt electrode that has been subjected to annealing and has orientation on a (111) plane, followed by drying at 100 to 200° C. and calcination at 300 to 700° C. is repeated a plurality of times to achieve a film thickness of 30 to 150 nm or less. By conducting the burning step subsequently, an oriented piezoelectric film having (111) orientation can be obtained.

The burning step is for the purpose of burning the calcined coat at a temperature of the crystallization temperature or more for the crystallization, and as a result of this burning step, an oriented piezoelectric film of the present invention is obtained. An atmosphere for the burning in this crystallization process can be, for example, $O_2$, $N_2$, Ar, $N_2O$, $H_2$ or a mixed gas of these. The burning is preferably conducted by maintaining a temperature of above 700° C. and 1100° C. or less for 1 to 60 minutes. The burning can be conducted by a rapid heat treatment (RTA treatment). The speed of raising the temperature from a room temperature to the above burning temperature is preferably set to be at 10 to 100° C. per second.

The mechanism of (111) orientation is believed to be as follows without being necessarily bound to the following theory. In other words, it is believed that the orientation of the film is influenced by the elimination of the stabilizing agent from the metal alkoxide, and by the timing of the stage of producing a crystal nucleus. Lowering the coordinating ability of the stabilizing agent included in the barium titanate based coating liquid composition of the present invention facilitates the elimination of the stabilizing agent. Therefore, the growth of the crystal grain at the crystal grain growing stage involved in the burning process of the film is promoted, and the growth of the crystal grain is epitaxially oriented along a (111) plane of, for example, the Pt electrode of the base plate as an undercoat to achieve a film having (111) orientation. As a result of this, it is believed to improve the piezoelectric properties. The coordinating ability of the stabilizing agent mentioned here means the interaction between the metal elements in the metal alkoxide and the stabilizing agent.

<Liquid Dispensing Head>

A liquid dispensing head of the present invention includes a liquid dispensing hole, a pressure chamber in communication with the liquid dispensing hole, and an actuator for changing the volume of a liquid to dispense the liquid from the liquid dispensing hole to the pressure chamber. The actuator includes, a vibration plate, a lower electrode, a piezoelectric film including a barium titanate based film formed on a base plate, and an upper electrode, which are sequentially disposed with respect to the pressure chamber side.

Figure 5:
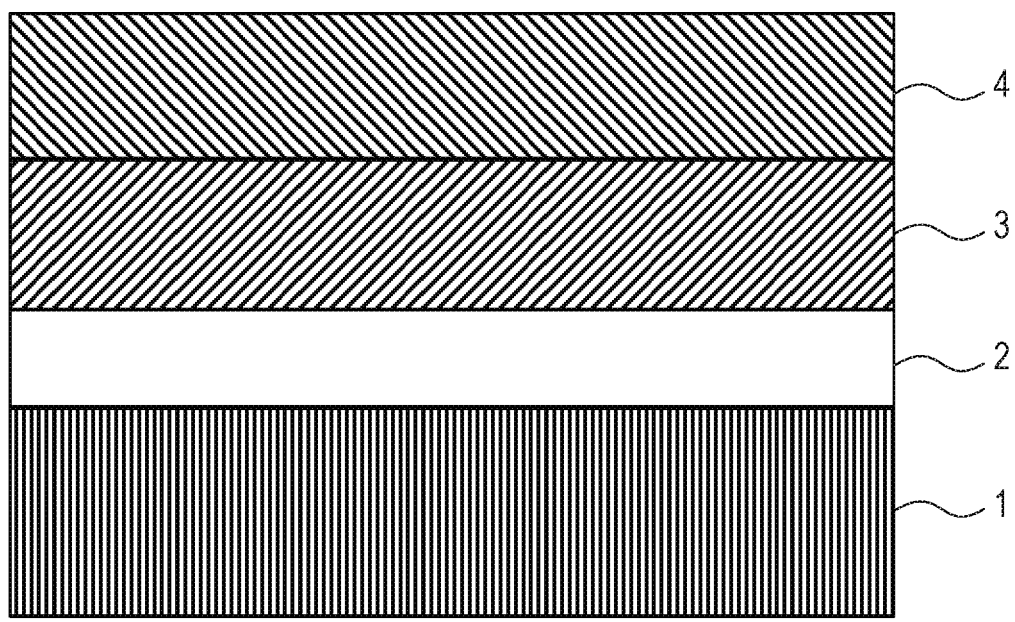
FIG. 5 is a vertical cross-sectional schematic view illustrating a piezoelectric actuator used in the present invention.

An exemplary actuator used in the present invention is illustrated in a vertical cross-sectional schematic view of FIG. 5. In FIG. 5, the reference number 1 represents a base plate as an undercoat, the reference number 2 represents an intermediate layer, the reference number 3 represents a lower electrode, and the reference number 4 represents a piezoelectric film.

Also, in general, the orientation controlling layer controls the orientation of the piezoelectric layer stacked on the orientation controlling layer. The orientation controlling layer suppress the diffusion of elements of the piezoelectric thin film layer toward the electrode side due to thermal loads associated with the heat treatment in the deposition process. In addition, Ti in the intermediate layer between the lower electrode and the base plate also diffuses into the electrode and the piezoelectric thin film due to thermal loads; however, with the interposition of the intermediate layer, the diffusion of Ti is reduced. The film thickness of this layer is preferably in 5 nm or more and 100 nm or less; however, in the present invention, the orientation of the piezoelectric thin film layer is controlled by the orientation of the electrode 3, and therefore, the intermediate layer can be eliminated when the intermediate layer has negative influence on the control of the orientation of the piezoelectric thin film layer.

The material of the base plate 1 as an undercoat is preferably a material at least including $SiO_2$ in the top surface layer, and, with regard to for the rest, having no deformation and melting due to thermal loads in the drying step after coating. Also, it is preferable that the base plate 1 as an undercoat has a smooth surface, can prevent the diffusion of elements during the heat treatment, and has a sufficient mechanical strength. Also, when a liquid dispensing head is produced using a piezoelectric film including a barium titanate based film obtained by the present embodiment, the base plate 1 as an undercoat can be also used as a vibration plate of a pressure chamber for forming the pressure chamber. For example, for the sake of such a purpose, a semiconductor base plate formed by silicon (Si) and having a film of Sift as a surface layer formed by thermal oxidation is preferably used; however, ceramics such as zirconia, alumina and silica can also be used. Also, when the top surface layer is formed by $SiO_2$, a plurality of these materials can be combined, or can be stacked to achieve a multi-layered configuration.

The intermediate layer 2 is a layer for serving to adhere the $SiO_2$ layer on the lower side to the electrode on the upper side. Using only Pt, which is a metal and $SiO_2$ which is an oxide leads not only to poor adhesion, but also to poor crystallinities of the electrode and the piezoelectric layer to be deposited on the electrode, and as a result of this, good piezoelectric performance cannot be obtained. Also, a too thick thickness of the intermediate layer is problematic. When the thickness of the intermediate layer is over 30 nm, the crystallinity of the piezoelectric layer in the upper layer tends to be worse gradually. Therefore, the intermediate layer is preferably in thickness of 5 nm or more and less than 50 nm. The material of the intermediate layer 2 is preferably Ti oxides typified by Ti or $TiO_2$.

The material of the lower electrode 3 is in the form of an electrically conductive layer of 5 to 2000 nm, and with regard to a piezoelectric device, can usually include metals such as Ti, Pt, Ta, Ir, Sr, In, Sn, Au, Al, Fe, Cr or Ni, or oxides of these. In particular, the material of the lower electrode 3 is preferably a metal in which a plane forming the piezoelectric film has (111) orientation, and preferably is Pt. Also, there are several methods for forming the electrode, such as a sol-gel process, a sputtering process and a vapor deposition process; however, the formation of the electrode by a sputtering process is most preferable in view of the fact that the sputtering process enables the formation of the electrode without increased temperatures. The thickness of the electrode is not limited in particular as long at the thickness of the electrode results in electrical conductivity; and the thickness of the electrode is desirably of 10 to 1000 nm. Also, the formed electrode can be patterned into a desired shape before the use.

The material of the piezoelectric film 4 can be a barium titanate based piezoelectric film obtained by application, calcination and burning of the barium titanate based coating liquid composition of the present invention.

Figure 6:
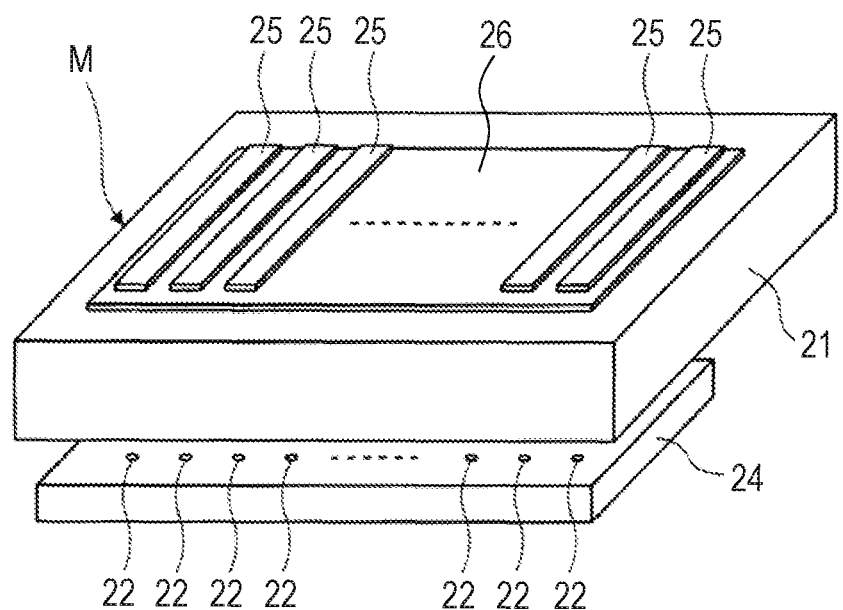
FIG. 6 is a schematic perspective view illustrating a liquid dispensing head according to one embodiment of the present invention.
Figure 7:
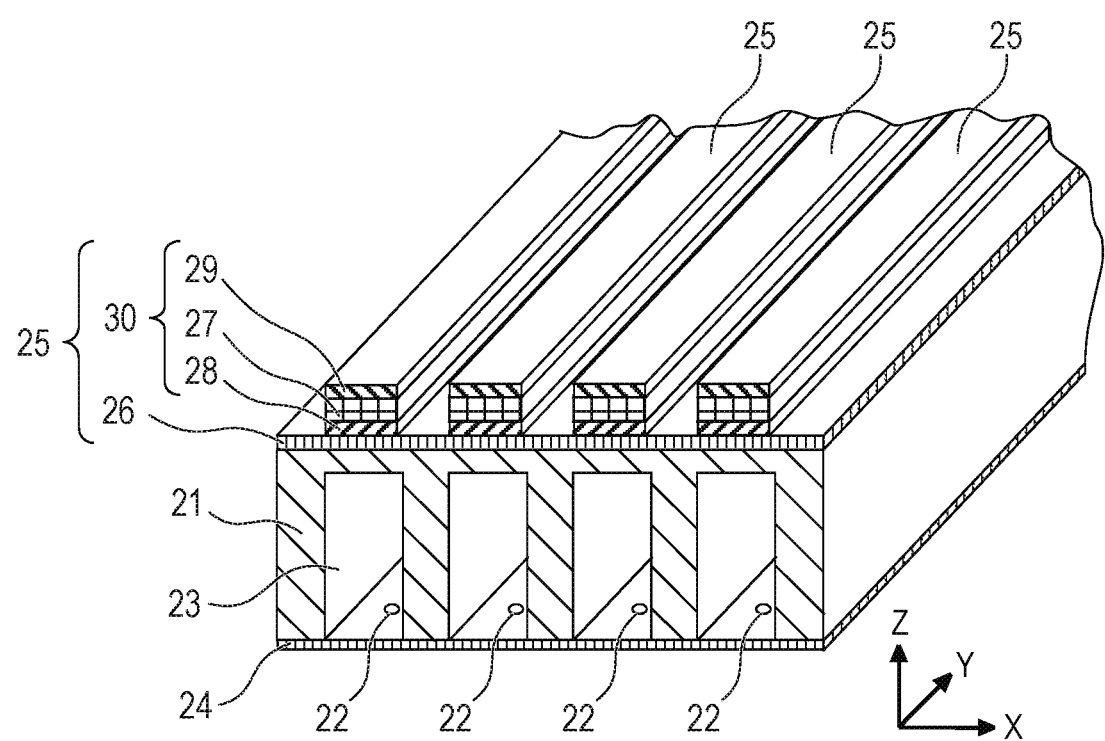
FIG. 7 is a schematic cross-sectional perspective view illustrating a liquid dispensing head according to one embodiment of the present invention.
Figure 8:
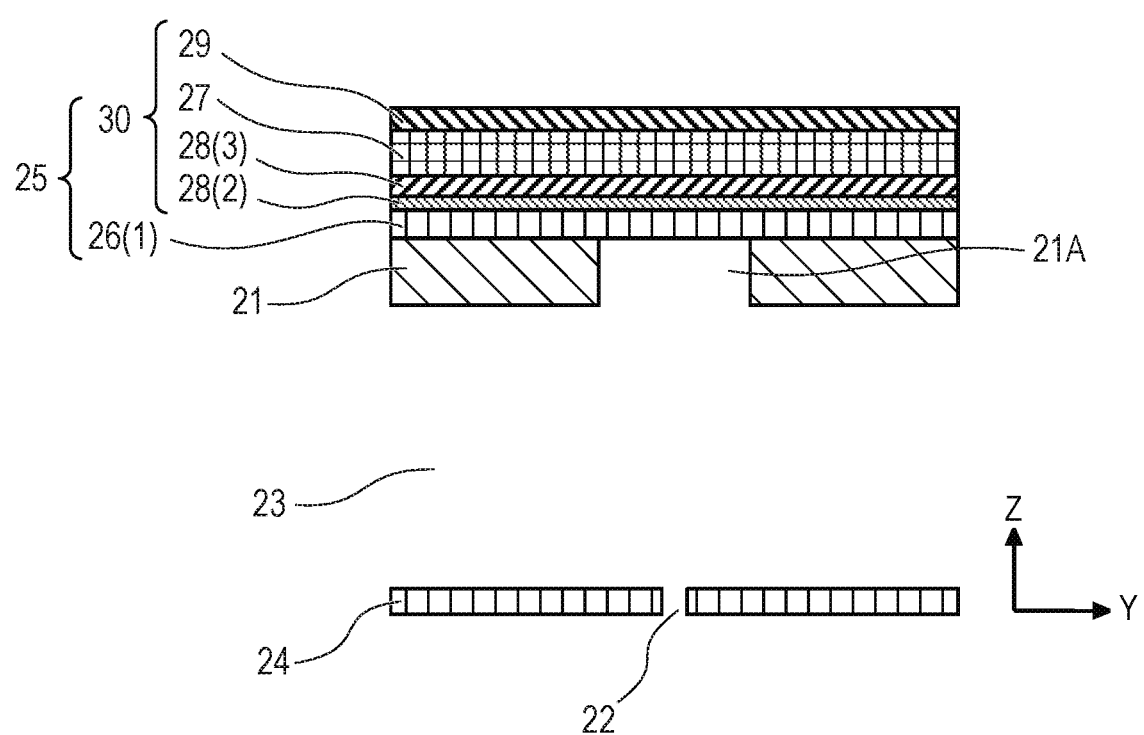
FIG. 8 is a schematic cross-sectional view illustrating a liquid dispensing head according to one embodiment of the present invention.

In one embodiment, the liquid dispensing head used in the present invention includes a piezoelectric film, as illustrated in FIGS. 6 to 8. This liquid dispensing head M includes a base plate 21 for a liquid dispensing head, a plurality of liquid dispensing holes 22, a plurality of pressure chambers 23, and actuators 25 arranged for the respective pressure chambers 23. The respective pressure chambers 23 are disposed so as to match the respective liquid dispensing holes 22, and are in communication with the liquid dispensing hole 22. The actuator 25 vibrates to change the volume of a liquid within a pressure chamber 23 so as to dispense the liquid from the liquid dispensing hole 22. The liquid dispensing holes 22 are formed on a nozzle plate 24 with predetermined spaces, and the respective pressure chambers 23 are formed in parallel so as to match the base plate 21 for the liquid dispensing head and to match the respective liquid dispensing holes 22. In the present embodiment, the liquid dispensing hole 22 is disposed on the undersurface of the actuator 25; however, the liquid dispensing hole 22 may be disposed on the side surface of the actuator 25. An opening, which is not shown in the figures, corresponding to each of the pressure chambers 23 is formed on the top surface of the base plate 21 for the liquid dispensing head, and each of the actuators 25 is disposed so as to block the opening. Each actuator 25 includes a vibration plate 26 and a piezoelectric device 30, and the piezoelectric device 30 includes a piezoelectric layer 27 and a pair of electrodes (a lower electrode 28 and an upper electrode 29). The material of the vibration plate 26 is not limited in particular, and the material of the vibration plate 26 is preferably a semiconductor such as Si, a metal, a metal oxide, glass and the like. The piezoelectric device 30 and the vibration plate 26 can be joined or adhered to one another, and, when the vibration plate 26 is used as a base plate, the lower electrode 28 and the piezoelectric thin film 30 can be formed directly on the base plate. Furthermore, the vibration plate 26 can be formed directly on the base plate 21 for the liquid dispensing head.

Examples of the liquid used in the present invention can include an ink, and examples of the liquid dispensing head can include an ink jet printing head.

EXAMPLES

The present invention will be described below in a more detailed manner by using Examples and Comparative Examples.

Note that the present invention is not limited to the following Examples.

The observation of a cross-section of the coating films of Examples was conducted using a scanning electron microscope (SEM, trade name "QuantaFEG 250", manufactured by FEI) at an acceleration voltage of 10 kV. The backscattered electron diffraction (EBSD) evaluation was conducted using a TSL-EBSD system (TSL Solutions K.K.).

Example 1

Firstly, Ti was deposited as an adhesive layer on a thermally oxidized Si base plate by a DC sputtering process, and subsequently, Pt was deposited by a DC sputtering process. According to XRD and backscattered electron diffraction (EBSD) evaluation, the deposited Pt layer had orientation on a (111) plane, and the crystal grain size was in 20 to 50 nm. This Si base plate provided with the Pt electrode was subjected to annealing to improve the degree of orientation (crystallinity and crystal grain size) of the Pt layer. With regard to the annealing conditions, the particle size of Pt is increased to be 100 to 400 nm by the annealing at an annealing temperature of 1000° C. for 10 minutes, and the average crystal grain size was about 150 nm, and the crystallinity was also improved. As a result of this, a base plate having an improved seed effect of the Pt electrode was obtained.

Next, ethyl acetoacetate as a stabilizing agent was added to a mixed solvent of 2-methoxyethanol and 3-methoxymethylbutanol, and, into the resulted solution, barium di-i-propoxide, titanium-n-butoxide and zirconium-n-butoxide were dissolved, followed by reflux for about 8 hours to prepare a coating liquid composition. The molar ratio in the solution was set to be with 2-methoxyethanol: 3-methoxymethylbutanol:ethyl acetoacetate: 2-ethylhexanoic acid: barium di-i-propoxide:titanium-n-butoxide:zirconium-n-butoxide=18:12:A:B: 1:0.97:0.03. The coating liquids 1 to 4 having different molar ratios of ethyl acetoacetate (A) to 2-ethylhexanoic acid (B) was set to be with A:B=3:0, 5:0, 3:1 and 1:1, respectively.

Using the coating liquid prepared in the above manner a film was formed by a spin coating process on the above described Si base plate provided with the Pt electrode and that has been subjected to annealing. The drying step was conducted by heat treatment on a hot plate set at 150° C. for 5 minutes, and subsequently, the calcination step was conducted by heat treatment at 450° C. in an infrared heating furnace for 10 minutes, and subsequently, the burning step was conducted at 1000° C. for 10 minutes. The obtained film was subjected to morphological observation by SEM and orientation evaluation by EBSD. The degree of orientations in cases of using the coating liquids 1 to 4 are shown in Table 1. Also, SEM images of a surface of each of the films are illustrated in FIGS. 1A to 1D.

When the molar ratio of ethyl acetoacetate (A) to 2-ethylhexanoic acid (B) was set to be with A:B=3:0, a high degree of 111 orientation was obtained. In view of the SEM image of this film in FIG. 1A, it has been found that this film in FIG. 1A has promoted growth of the crystal grain, compared to the films using the other coating liquids illustrated in FIGS. 1B to 1C. In a case where the amount of ethyl acetoacetate was high amount, and in a case where 2-ethylhexanoic acid have been added, the degree of orientation was decreased. In a case where 3 mol of ethyl acetoacetate have been added and 2-ethylhexanoic acid has not been added, it is believed that the growth of the crystal grain was promoted, and as a result of this, the crystal grain tended to grow epitaxially along a (111) plane of the Pt electrode of the base plate as an undercoat to result in the film having (111) orientation.

As a result of the above process, the barium titanate based film of the present invention having a high degree of orientation on a (111) plane (degree of 111 orientation) was obtained by adjusting the amounts of ethyl acetoacetate and 2-ethylhexanoic acid.

Here, the degree of 111 orientation means a proportion of the area occupied by the crystal grain, wherein the (111) plane in EBSD measurement is within 5 degrees with respect to the base plate.

TABLE 1

|  | Ethyl acetoacetate | 2-Ethylhexanoic acid | Degree of 111 orientation |
| --- | --- | --- | --- |
| Coating liquid 1 | 3 | 0 | 0.95 |
| Coating liquid 2 | 5 | 0 | 0.10 |
| Coating liquid 3 | 3 | 1 | 0.40 |
| Coating liquid 4 | 1 | 1 | 0.05 |

Example 2

The present Example relates to the type of the stabilizing agent that results in a film having a high (111) orientation.

An experimentation similar to as in Example 1 was conducted using butyl acetoacetate, ethyl 3-oxohexanoate, ethyl 2-fluoroacetoacetate, ethyl 2-methylacetoacetate, or ethyl 2-ethylacetoacetate as a stabilizing agent. The amount of the stabilizing agent was fixed to be 3 mole, and set to be with 2-methoxyethanol: 3-methoxymethylbutanol: stabilizing agent:barium di-i-propoxide:titanium-n-butoxide:zirconium-n-butoxide=18:12:3:1:0.97:0.03. The film having no stabilizing agent was also produced. Thus prepared coating liquids were deposited by a method similar to as in Example 1, and the orientation evaluation by EBSD was conducted. The degree of orientation of the film produced from the coating liquid using each of the stabilizing agents, and the degree of orientation of ethyl acetoacetate in Example 1 are shown in Table 2. Also, the SEM images of a surface of the films are illustrated in FIGS. 2A to 2F. (a) represents butyl acetoacetate, (b) represents ethyl 3-oxohexanoate, (c) represents ethyl 2-fluoroacetoacetate, (d) represents ethyl 2-methylacetoacetate, (e) represents ethyl 2-ethylacetoacetate, and (f) represents no addition of the stabilizing agent. When butyl acetoacetate or ethyl 3-oxohexanoate was used, a high degree of orientation similar to as in ethyl acetoacetate was exhibited. When ethyl 2-fluoroacetoacetate, ethyl 2-methylacetoacetate or ethyl 2-ethylacetoacetate was used, random orientation was produced as in the case of no addition of the stabilizing agent, and the degree of orientation was low.

As a result of the above process, the film of the present invention having a high degree of 111 orientation was obtained by optimizing the amounts of butyl acetoacetate, ethyl 3-oxohexanoate and 2-ethylhexanoic acid.

TABLE 2

| Stabilizing agent | Degree of 111 orientation |
| --- | --- |
| Ethyl acetoacetate | 0.95 |
| Butyl acetoacetate | 0.94 |
| Ethyl 3-oxohexanoate | 0.92 |
| Ethyl 2-fluoroacetoacetate | 0.14 |
| Ethyl 2-methylacetoacetate | 0.15 |
| Ethyl 2-ethylacetoacetate | 0.13 |
| No addition | 0.12 |

Example 3

The present Example relates to annealing conditions for obtaining the Si base plate provided with the Pt electrode and that results in the film having a high degree of 111 orientation.

As shown in Example 1 and Example 2, the film having a high degree of 111 orientation is obtained when ethyl acetoacetate, butyl acetoacetate or ethyl 3-oxohexanoate was used; however, in the present Example, relationship between the degree of orientation of the film and the annealing temperature of the Si base plate provided with the Pt electrode was evaluated. First, Si base plates provided with a Pt electrode was prepared in a manner similar to as in Example 1, and the base plates were heat-treated at an annealing temperature of 400° C., 600° C., 800° C. or 1000° C. for 10 minutes. On this base plate, a film was produced in a manner similar to as in Example 1 by using a coating liquid composition using the above three kinds of stabilizing agent to conduct the orientation evaluation by EBSD. Relationship between the annealing temperature of the base plate and the degree of orientations of the piezoelectric film are shown in Table 3. When butyl acetoacetate was used as the stabilizing agent, the highest degree of orientation was obtained, and when the annealing temperature of the base plate was at 600° C., the degree of orientation of about 0.8 was obtained. As a result of this, it has been found that the piezoelectric film having a high degree of orientation is obtained by setting the annealing temperature to be 500° C. or more. When ethyl 3-oxohexanoate was used as the stabilizing agent, the annealing temperature of the base plate of 1000° C. results in the good orientation. When the base plate was not subjected to annealing, the piezoelectric film having a good degree of orientation was not obtained in each case. As a result of the above process, when the same annealing conditions the Si base plate provided with the Pt electrode are employed, the piezoelectric films of butyl acetoacetate, ethyl acetoacetate and ethyl 3-oxohexanoate had a higher degree of orientation in this order.

TABLE 3

| Annealing temperature | Butyl acetoacetate | Ethyl acetoacetate | Ethyl 3-oxohexanoate |
| --- | --- | --- | --- |
| 1000° C. | 0.95 | 0.94 | 0.92 |
| 800° C. | 0.92 | 0.52 | 0.19 |
| 600° C. | 0.77 | 0.28 | 0.18 |
| 400° C. | 0.17 | 0.22 | 0.16 |
| No annealing | 0.16 | 0.17 | 0.15 |

Example 4 Film Thickening

Figure 3A:
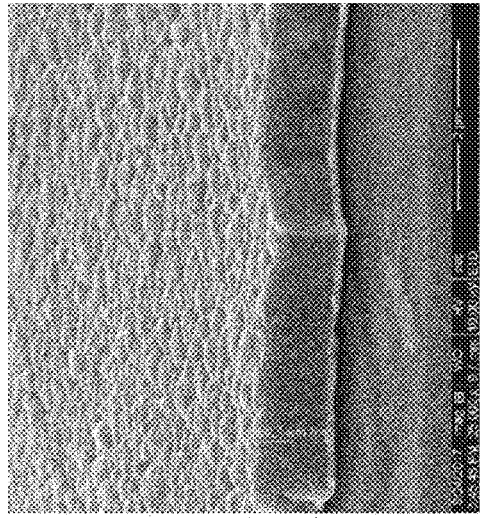
FIG. 3A is a SEM image of a surface of the film obtained in Example 4.
Figure 3B:
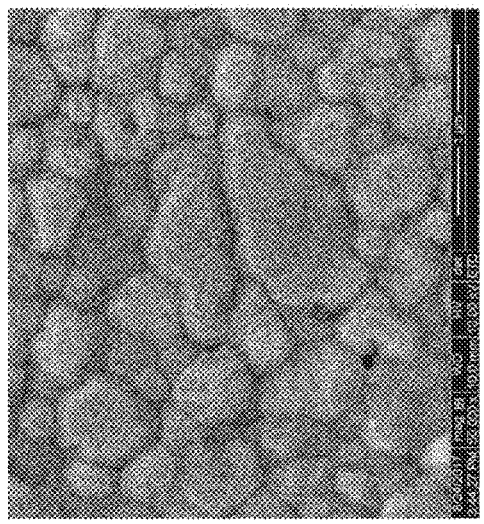
FIG. 3B is a cross-sectional SEM image of the film obtained in Example 4.

On the layer of the (111) oriented piezoelectric film obtained in the conditions of Examples 1 to 3, similar process were repeated to obtain the film thickening. By using the coating liquid composition with the addition of 3 moles of ethyl acetoacetate as the stabilizing agent, a film forming step in a manner similar to as in Example 2 was repeated to obtain the film thickening. As the drying step, heat treatment was conducted on a hot plate set at 150° C. for 5 minutes, and as the calcination step, heat treatment was conducted at 450° C. in an infrared heating furnace for 10 minutes, and subsequently, the burning step was conducted at 1000° C. for 10 minutes. This step was repeated in 16 times to produce a thick film, and the morphological observation by SEM and the orientation evaluation by EBSD were conducted. The SEM images of the surface are illustrated in FIG. 3A, and the cross-sectional SEM images are illustrated in FIG. 3B. In view of the SEM results, it has been found that the film having a particle size of several hundred nanometers and having the film thickness of 900 nm was obtained. The degree of 111 orientation of the obtained film had a high degree of orientation of 0.90.

Here, Lotgering factor, which is an indicator of the degree of orientation by X-ray diffraction, was evaluated. The calculation method of Lotgering factor employed the peak intensity of the X-ray diffracted from the crystal plane of interest to conduct the calculation according to the formula 1.

$$F=(\rho-\rho_0)/(1-\rho_0) \quad \text{(Formula 1)}$$

Here, $\rho_0$ was calculated using the diffraction intensity ($I_0$) of the X-ray of the non-oriented sample, and with regard to the tetragonal crystal having (001) orientation, is calculated as the total proportion of the diffraction intensities of the (111) plane based on the sum of all of the diffraction intensities, according to formula 2.

$$\rho_0=\Sigma I_0(111)/\Sigma I_0(hkl) \quad \text{(Formula 2)(h, k and l are integers.)}$$

$\rho$ was calculated using the diffraction intensity (I) of the X-ray of the oriented film, and with regard to having the tetragonal crystal (111) orientation, was calculated as the total proportion of the diffraction intensities of the (111) plane based on the sum of all of the diffraction intensities, according to formula 3 as in the case of the above formula 2.

$$\rho = \Sigma I(111)/\Sigma I(hkl) \quad \text{(Formula 3)}$$

Figure 4:
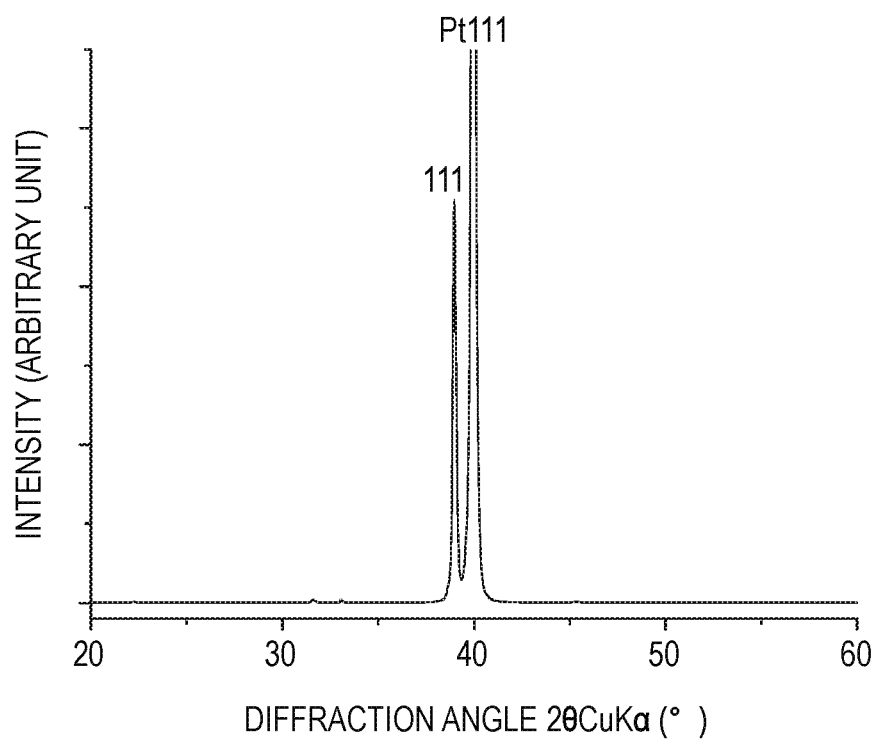
FIG. 4 is X-ray diffraction results of the film obtained in Example 4.

The X-ray diffraction results of the produced thick film having (111) orientation are illustrated in FIG. 4. There are almost diffraction peaks of 111, and the produced thick film had a degree of orientation with Lotgering factor F=0.98.

As a result of the above process, even in a case where the deposition is conducted on the oriented film in a manner similar to as in the above description, the epitaxial growth along the (111) plane of the BTZ film as an undercoat is achieved, and the orientation is maintained. As a result of this, the film forming step was repeated to obtain the (111) oriented piezoelectric film having a desired film thickness. Although only one of the conditions was illustrated in the present Example, the above step is repeated depending on the degree of orientations shown in Examples 1 to 3 to enable the film thickening with maintaining the degree of orientation.

According to the present invention, a barium titanate based film having high (111) orientation can be provided.

According to the present invention, it is possible to provide, without using a single-crystal seed layer, a barium titanate based piezoelectric film having (111) orientation, and a method for producing the piezoelectric film.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-116838, filed Jun. 20, 2018, which is hereby incorporated by reference herein in its entirety.

What is claimed is:

1. An oriented piezoelectric film comprising a perovskite type crystal represented by general formula (1):

$$Ba_{1-x}Ca_xTi_{1-y}Zr_yO_3 (0 \leq x \leq 0.2, \text{ and } 0 \leq y \leq 0.2) \quad (1),$$

wherein the oriented piezoelectric film is formed on a metallic electrode having a (111) orientation, and has the (111) orientation according to a pseudocubic crystal notation.

2. The oriented piezoelectric film according to claim 1, wherein an abundance of the (111) orientation determined by a backscattered electron diffraction (EBSD) method is 50% or more on a surface of the oriented piezoelectric film, and in view of an inverse pole figure in a normal line direction of the oriented piezoelectric film, variation in angles of the (111) orientation is within 5 degrees.

3. The oriented piezoelectric film according to claim 1, wherein the metallic electrode comprises at least one of platinum and gold.

4. A liquid dispensing head comprising:
a liquid dispensing hole;
a pressure chamber in communication with the liquid dispensing hole; and
an actuator for changing a volume of a liquid to dispense the liquid from the liquid dispensing hole to the pressure chamber,
wherein the actuator comprises:
a vibration plate, a lower electrode, the oriented piezoelectric film according to claim 1, wherein the lower electrode is the metallic electrode, and an upper electrode, which are sequentially disposed with respect to a pressure chamber side of the actuator.

* * * * *